United States Patent
Nagano et al.

[11] Patent Number: 6,011,980
[45] Date of Patent: Jan. 4, 2000

[54] WIRELESS TELECOMMUNICATION EQUIPMENT

[75] Inventors: Tomonori Nagano; Waho O; Tsutomu Katsuyama, all of Tokyo, Japan

[73] Assignee: Oki Electric Industry Co., Ltd., Tokyo, Japan

[21] Appl. No.: 08/900,703

[22] Filed: Jul. 25, 1997

[30] Foreign Application Priority Data

Aug. 21, 1996 [JP] Japan .................................. 8-219786

[51] Int. Cl.[7] .................................................. H04B 7/00
[52] U.S. Cl. ........................... 455/572; 455/69; 455/126; 455/245; 330/279
[58] Field of Search .................................. 455/69, 234.1, 455/234.2, 239.1, 240.1, 245.1, 245.2, 522

[56] References Cited

U.S. PATENT DOCUMENTS

| | | | |
|---|---|---|---|
| 5,107,225 | 4/1992 | Wheatley, III et al. | 330/279 |
| 5,142,695 | 8/1992 | Roberts et al. | 455/89 |
| 5,283,536 | 2/1994 | Wheatley, III et al. | 330/279 |
| 5,442,811 | 8/1995 | Kobayashi et al. | 455/67.3 |
| 5,452,473 | 9/1995 | Weiland et al. | 455/88 |
| 5,521,937 | 5/1996 | Kondo et al. | 375/206 |
| 5,564,080 | 10/1996 | Eul et al. | 455/69 |
| 5,590,408 | 12/1996 | Weiland et al. | 455/69 |
| 5,603,113 | 2/1997 | De Loe, Jr. | 455/234.1 |
| 5,627,857 | 5/1997 | Wilson | 375/219 |
| 5,655,220 | 8/1997 | Weiland et al. | 455/69 |
| 5,659,582 | 8/1997 | Kojima et al. | 375/345 |
| 5,697,096 | 12/1997 | Aoki et al. | 455/343 |
| 5,722,061 | 2/1998 | Hutchinson, IV et al. | 455/245.1 |
| 5,722,063 | 2/1998 | Peterzell et al. | 455/287 |
| 5,732,341 | 3/1998 | Wheatley, III | 455/234.1 |
| 5,768,694 | 6/1998 | Kumagai | 455/126 |
| 5,819,165 | 10/1998 | Hulkko et al. | 455/126 |
| 5,859,838 | 1/1999 | Soliman | 370/249 |

OTHER PUBLICATIONS

TIA/EIA/Interim Standard–95–A, Mobile Station–Base Station Compatibility Standard for Dual–Mode Wideband Spread Spectrum Cellular System, pp. 6–1/6–10, May 1995.
Hefeng Wang et al., "CD3000B Portable Telephone for CDMA Cellular Systems", OKI Technical Review 156, pp. 71–74 Jul. 1996.
TIA/EIA/IS–95–A, pp. 6–6.

*Primary Examiner*—Wellington Chin
*Assistant Examiner*—Pablo N. Tran
*Attorney, Agent, or Firm*—Venable; Robert J. Frank

[57] ABSTRACT

A wireless telecommunication equipment having a receiver portion and a transmitter portion. An automatic gain control amplifier having a gain varied in accordance with an automatic gain control signal input thereto is located in the receiver portion of the equipment, and a transmission power control amplifier having a gain varied in accordance with an open loop control signal input thereto is located in the transmitter portion of said equipment. The automatic gain control and the transmission power control amplifiers have the same operating characteristics.

9 Claims, 4 Drawing Sheets

WIRELESS TELECOMMUNICATION EQUIPMENT

CROSS REFERENCE TO RELATED APPLICATION

This application claims the priority of Japanese Application Serial No. 219786/1996 filed Aug. 21, 1996, the subject matter of which is incorporated herein by reference.

BACKGROUND OF THE INVENTION

This invention relates to wireless telecommunication equipment, and in particular, to the mobile station of a code division multiple access (CDMA) cellular phone system. The CDMA system, which employs spread spectrum modulation, has a base station and a plurality of mobile stations wherein each mobile station includes a receiver portion and a transmitter portion, and is provided with a transmission power controller.

In the CDMA system, each mobile station is provided with a spread spectrum demodulator which despreads a received spread spectrum signal in accordance with a distinctive spreading code assigned to that mobile station. Each mobile station has a different spreading code, and interference often occurs between the mobile stations. The amount of interference depends on the correlation characteristic of the spreading code of each mobile station.

As the interference occurring when a signal is sent from one mobile station to another increases, the signal-to-noise ratio (S/N) of the demodulated signal decreases. Consequently, the strength of the radio wave transmitted by the mobile station must be constantly changed as a function of the distance between the mobile station and the base station, and to compensate for fading due to variations in the transmission path. This means that to maximize system capacity it is necessary to control transmission power so that the radio signal transmitted from each mobile station to the base station remains at the same level.

The transmission power of a conventional CDMA mobile station is controlled by employing both open and closed loop control of the power transmitted on a down channel from the base station to a mobile station. In the open loop power control, the control circuits of the mobile station initially assume that the radio signal is attenuated in the same way in both the down channel and in the up channel from the mobile station to the base station. An estimate is made of the propagation loss in the down channel by measuring the received power level at the mobile station, predicting the power required for the up channel and using this information to control the power transmitted by the mobile station.

FIG. 2 is a graph showing the open loop power control characteristic of a CDMA cellular portable telephone which complies with the United States standard for CDMA telephones. In FIG. 2, the transmission power of a mobile station is plotted against the strength of the signal received at the mobile station and shows that, using open loop power control, the dynamic range of the transmission power must be at least 80 dBm. However, a closed loop power control is also needed because the propagation losses of the down and up channels are not the same since each channel uses a different frequency band.

In the closed loop power control, the base station measures the received signal strength, and sends a power control bit to a mobile station along with normal information data at 1.25 ms intervals using a down channel. The mobile station provides a fine control of the transmitted power with a 1 dB pitch, which is in addition to the transmitted power predicted by the open loop power control. That is, the open loop power control provides an approximate or rough control of the transmitted power, and the closed loop power control performs a fine control of the transmitted power. However, the characteristic of the conventional open loop power control is such that the closed loop power control is nDt sufficiently effective. Thus, there is a need for an improved open loop power control.

The open loop power control characteristic of the conventional CDMA cellular portable telephone standardized for use in the United States has an allowable error in the transmitted power strength which is within ±9.5 dBm despite variations in the environment including changes in temperature. This is in comparison with the received power (receive signal strength) vs. transmission power (transmission signal strength) characteristic shown in FIG. 2.

However, the receiver and transmitter portions of conventional mobile stations are comprised of power amplifiers and many other functional components having individual gain variation characteristics. These variations, added to variations in the environmental temperature can result in the allowable error being exceeded if the differences in gain variation between components of the receiver and transmitter portions of the mobile station are unduly large. In other words, using a conventional open loop power control wherein the transmission signal strength in the transmitter portion of the mobile station is controlled in accordance with the strength of the received signal, the allowable error at a mobile station could be exceeded if the difference in the gain variations between the receiver and transmitter portions of the station is too large. This problem occurs not only in mobile stations associated with CDMA cellular portable telephone systems but also in other wireless telecommunication equipment having open loop power control.

SUMMARY OF THE INVENTION

It is an object of this invention to provide a wireless telecommunication equipment having a stable and desirable open loop power control characteristic which compensates for variations in the environment. It is another object of this invention to provide a wireless telecommunication equipment having a receiver portion including an automatic gain control amplifier and a transmitter portion having a transmission power control amplifier which provide a mobile station which is free from variations in gain despite changes in the environment.

In accordance with the present invention, a wireless mobile telecommunication equipment is provided having a receiver portion and a transmitter portion, for example a CDMA cellular portable telephone system which comprises an automatic gain control amplifier located in the receiver portion and a transmission power control amplifier located in the transmitter portion having first and second gains respectively. The first gain is varied in accordance with an automatic gain control signal input thereto, and the second gain is varied in accordance with an open loop control signal input thereto. Both the automatic gain control amplifier and the transmission power control amplifier have the same operating characteristic. Each of these amplifiers has the same bias applied thereto, the same characteristics including the same central gain, and the same circuitry. By central gain, is meant the midpoint of a variable gain range of an amplifier.

In another aspect of the invention, a wireless telecommunication equipment having a receiver portion and a transmitter portion comprises an automatic gain control amplifier for changing a first gain in accordance with an automatic gain control signal input to the receiver portion, a transmission power control amplifier for changing a second gain in accordance with an open loop control signal input to the transmitter portion, and a plurality of fixed gain devices. Each of the fixed gain devices has a gain allocated thereto which equalizes the central gain of the automatic gain control amplifier with the central gain of the transmission power control amplifier.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE PREFERRED EMBODIMENT

The drawings illustrate a preferred embodiment of a mobile station for a CDMA cellular telephone system used as a wireless telecommunication equipment in accordance with the present invention.

Figure 1:
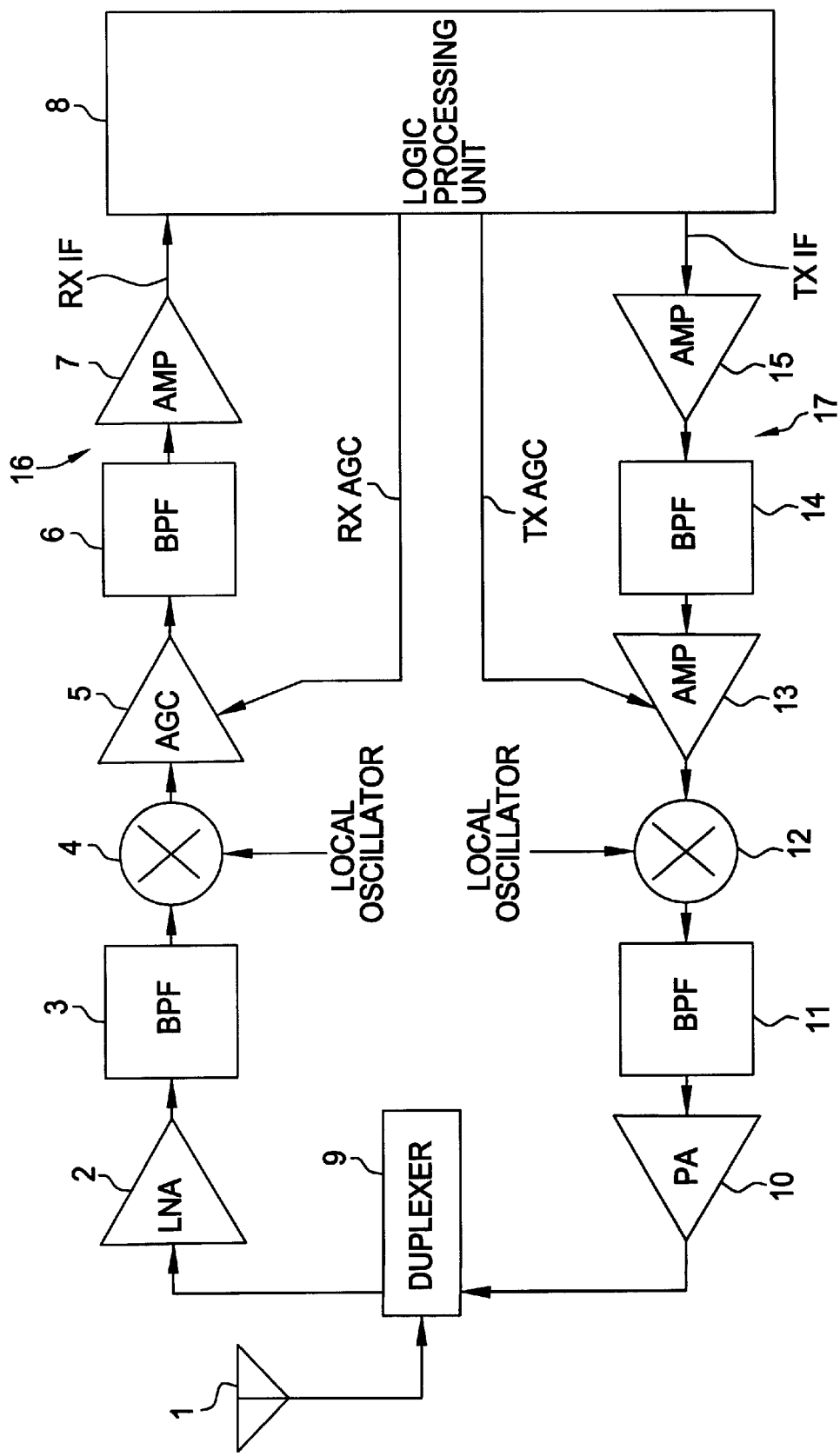
FIG. 1 is a functional schematic block diagram showing a mobile station according to an embodiment of the present invention.
Figure 3:
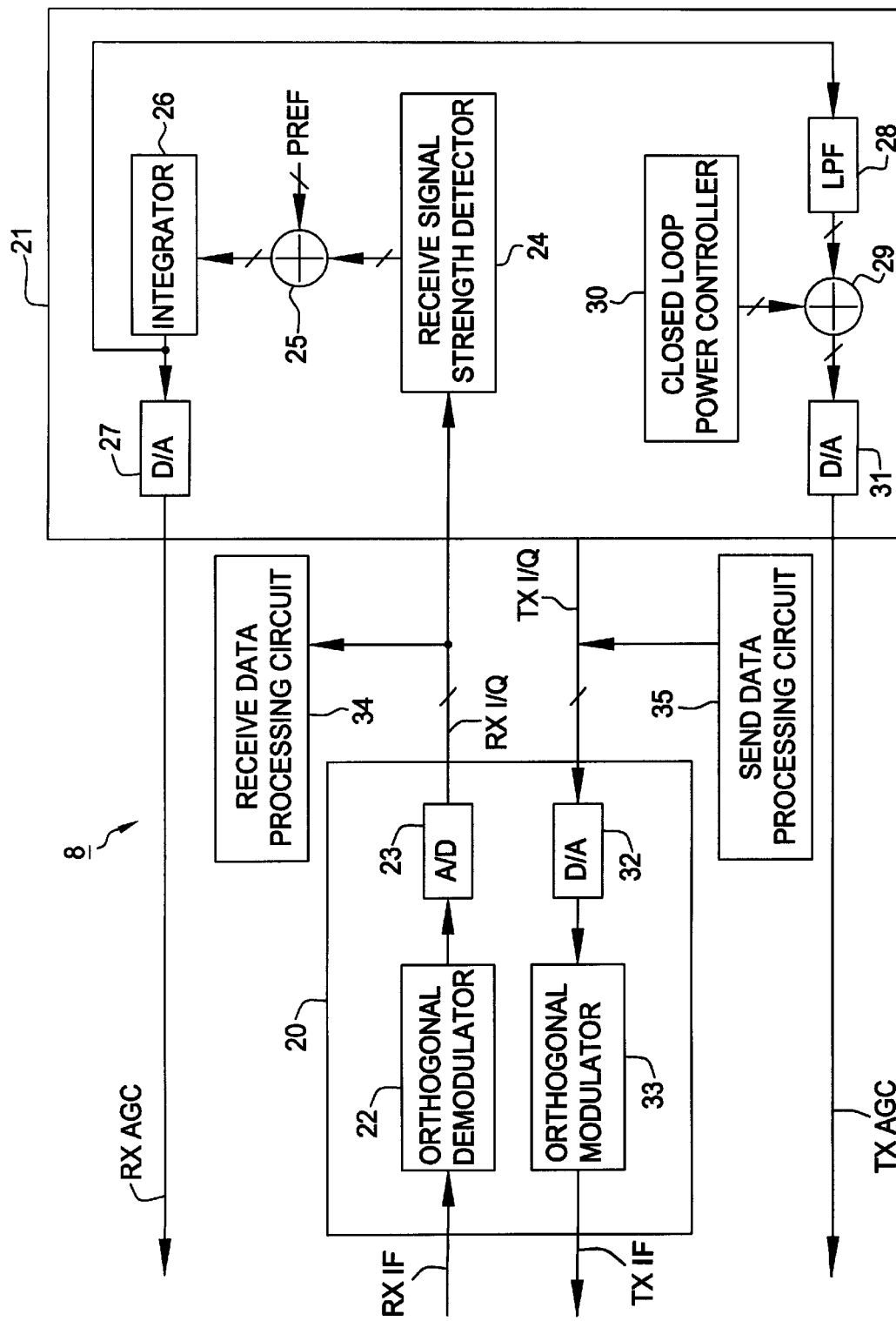
FIG. 3 is a schematic block diagram showing a logic processing unit according to the embodiment of the invention shown in FIG. 1.

FIG. 1 is a functional schematic block diagram showing a mobile station according to an embodiment of the present invention, and FIG. 3 is a schematic block diagram showing a logic processing unit 8 comprising a part of the mobile station of FIG. 1.

Referring to FIGS. 1 and 3, an input signal received at a common sending/receiving antenna 1 of a mobile station is input via a duplexer 9 to a low noise amplifier (LNA) 2 comprising the first stage of a receiver portion 16 of the mobile station. The LNA 2 amplifies the input signal with a fixed gain and inputs the amplified signal to a band pass filter (BPF) 3 which removes unnecessary signal components from the amplified input signal. Then, a mixer 4 mixes the filtered signal with a local oscillation signal obtained from a local oscillator (not shown), and the mixed signal is down-converted to a digital modulation signal (IF signal) in an intermediate frequency band, and output to an automatic gain control amplifier (AGC) 5.

A gain control signal (RX AGC) is input to the AGC 5 from the logic processing unit 8. The AGC 5 amplifies the IF signal with a gain determined by the gain control signal RX AGC. A BPF 6 removes unnecessary signal components from the amplified IF signal, and the signal filtered by the BPF 6 is further amplified with a fixed gain by a power amplifier (AMP) 7. The output of AMP 7 is output to the logic processing unit 8 as an intermediate frequency band signal (RX IF).

The logic processing unit 8, as shown in FIG. 3 comprises an analog part 20 and a digital part 21. The analog part 20 includes an orthogonal demodulator 22, an analog to digital (A/D) converter 23, a digital to analog (D/A) converter 32 and an orthogonal modulator 33.

The RX IF signal output from AMP 7 is input to the orthogonal demodulator 22. At the orthogonal demodulator 22, orthogonal demodulation is performed on the digital modulator signal using a local oscillation signal output from a local oscillator (not shown). At the output of the demodulator 22, I phase (inphase) and Q phase (quadrature phase) data signal components are output to the A/D converter 23. These signal components are converted by the A/D converter 23 to a digital base band signal RX I/Q, and output to a conventional receive data processing circuit 34 where the digital base band signal RX I/Q is de-spread using conventional spread spectrum technology to provide a transmission symbol sequence. The coventional receive data processing circuit 34 is for example disclosed in OKI Technical review 156 Vol. 62, July 1996, p71–74 (esp., p72, left column, the fifth and sixth paragraphs) "CD3000B Portable Telephone for CDMA Cellular Systems".

The base band signal RX I/Q is also input to a receive signal strength detector 24 which generates receive electric field strength data in accordance with the base band signal RX I/Q, and outputs this data to an adder 25. The adder 25 outputs data corresponding to the difference between the received electric field strength data from the receive signal strength detector 24 and fine adjustment power reference data (PREF) which is fixed and in correspondence with desirable signal strength for the A/D converter 23 and the receive data processing circuit 34. The difference data is integrated by an integrator 26, converted to an analog signal by a D/A converter 27, and output to the AGC 5 as a gain control signal RX AGC.

A base band signal TX I/Q is output from a conventional send data processing circuit 35 using conventional spread spectrum technology, as is for example disclosed in OKI Technical review 156 Vol.62, July 1996, p71–74 (esp., p72, left column, the forth paragraph) "CD3000B Portable Telephone for CDMA Cellular Systems". The signal TX I/Q includes an I phase data component and a Q phase data component which are converted to an analog base band signal by the D/A converter 32 and output to an orthogonal modulator 33. The orthogonal modulator 33 orthogonally modulates the input base band signal TX I/Q and generates a transmission signal (digital modulation signal) in the intermediate frequency band (TX IF) by using a local oscillation signal output from a local oscillator (not shown).

The transmission signal TX IF is input to a transmitter portion 17 of the mobile station where it is amplified by a fixed gain intermediate frequency amplifier AMP 15, unnecessary signal components removed by a BPF 14, and the signal TX IF output to a transmission power control amplifier AMP 13 for controlling the transmission power. The TX AGC gain control signal from the logic processing unit 8 is also input to AMP 13 which amplifies the signal input from the BPF 14 by a gain determined by the gain control signal TX AGC and outputs a transmnission signal to a transmission mixer 12.

The gain control signal TX AGC is obtained as follows. As shown in FIG. 3, the data corresponding to the receive power strength, which is output from the integrator 26, is filtered by a Low Pass Filter (LPF) 28 and output to an adder 29 as data for controlling the open loop power. The adder 29 combines data output from a conventional closed loop power controller 30, as is reqired in TIA/EIA/IS-95-A page 6-6, section 6.1.2.3.2 "Closed Loop Output Power", for controlling the closed loop power with the output of the -LPF 28, and the sum of these data are output to a D/A converter 31. The D/A converter 31 converts the input data to an analog signal and outputs the analog signal to the AMP 13 as the gain control signal TX AGC. When the receive power strength decreases, the gain control signal TX AGC increases, and as a result the gain of the AMP 13 and the transmission power is increased. When the receive power increases, the transmission power is reduced.

As shown in FIG. 1, the transmission mixer 12 receives as an input not only the transmission signal output from AMP 13 but also a local oscillation signal of the transmission channel frequency band which is output from a transmission channel frequency oscillator (not shown). The mixer 12 up-converts the transmission signal from the intermediate frequency band to the transmission channel band. Unnecessary signal components of the transmission signal up-converted to the transmission channel band are removed by a BPF 11, and output to power amplifier (PA) 10 which amplifies the received signal by a fixed gain. The output signal of the PA 10 is input to the common antenna 1 for broadcast via the duplexer 9.

In the mobile station, the gains of the fixed gain devices in the receiver portion 16 of the mobile station, i.e., the LNA 2, BPF 3, receiver mixer 4, BPF 6 and AMP 7, and the fixed gain devices in the transmitter portion 17, i.e., the PA 10, BPF 11, transmission mixer 12, BPF 14 and AMP 15 are allocated so as to equalize the central gain of the AGC 5 with the central gain of the AMP 13.

Further, the AGC 5 in the receiver portion 16 and the AMP 13 in the transmitter portion, which have the same central gain, also have the same circuit which results in an open loop power control with a better characteristic than that obtained with prior art CDMA systems. More specifically, the AGC 5 and the AMP 13 are comprised of amplifying devices having the same characteristic with respect to variation in the environment such as temperature. In addition, the same bias voltage is applied to the AGC 5 and AMP 13.

Figure 4:
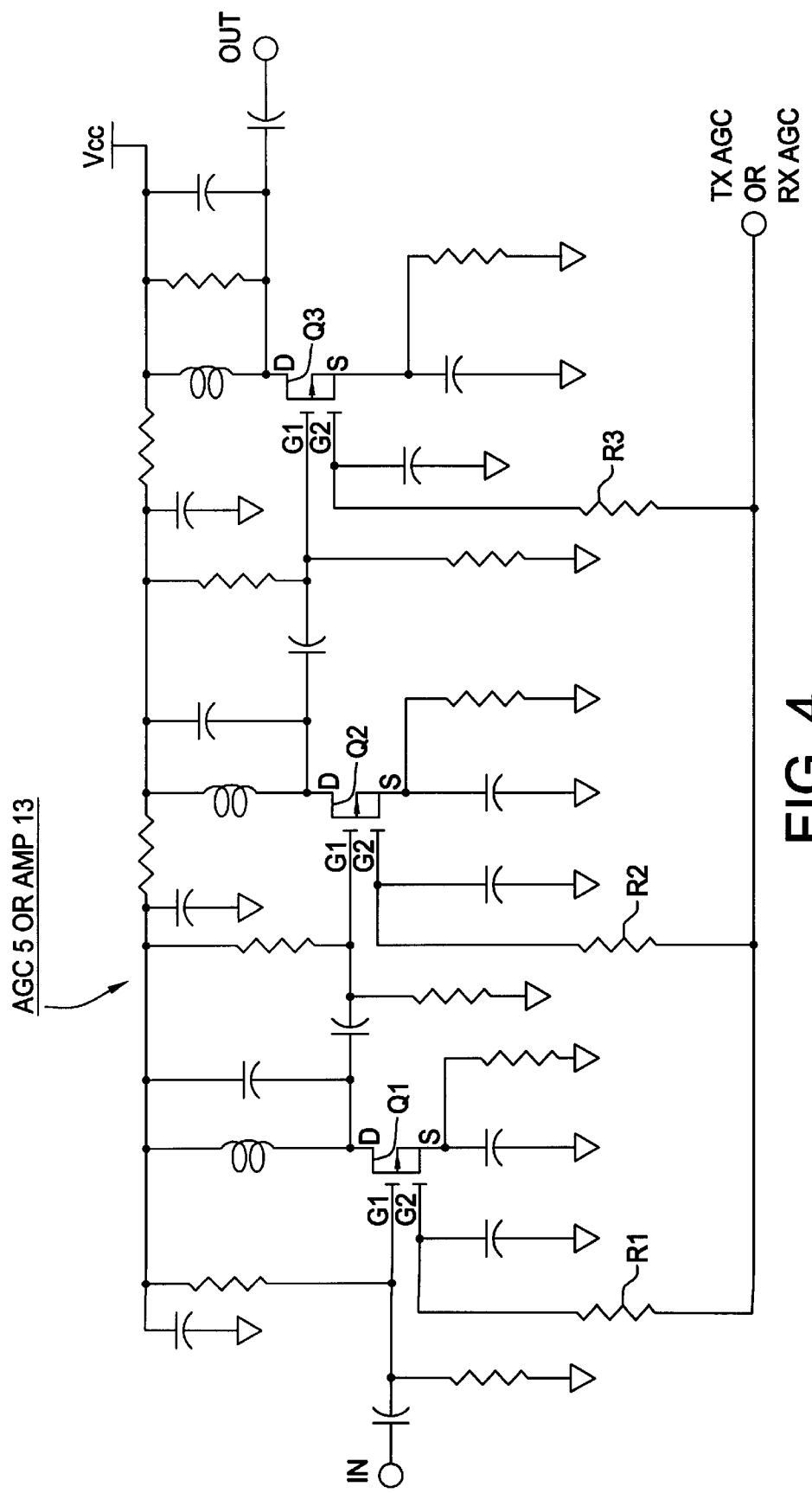
FIG. 4 is a schematic diagram of a circuit which may be used as both an automatic gain control amplifier and a transmission power control amplifier for the embodiment of the invention shown in FIG. 1.

FIG. 4 is a schematic circuit diagram showing both the AGC 5 and the AMP 13, these circuits being substantially identical. In the following description, the AGC 5 will be described but it will be understood that the description also applies to the AMP 13.

As shown in FIG. 4, the AGC 5 comprises three amplifying stages consisting of field effect transistors Q1, Q2 and Q3, each having an input gate terminal G1 and a control gate terminal G2. The gain of the AGC 5 is variable and controlled by applying the gain control signal RX AGC from the D/A converter 27 of the logic processing unit 8 to the control gates G2 of transistors Q1, Q2 and Q3 via gate resistances R1, R2 and R3. Similarly, the gain of the AMP 13 is variable and controlled by applying the gain control signal TX AGC from the D/A converter 31 of the logic processing unit 8 to the control gates G2 of transistors Q1, Q2 and Q3 via gale resistances R1, R2 and R3.

Figure 2:
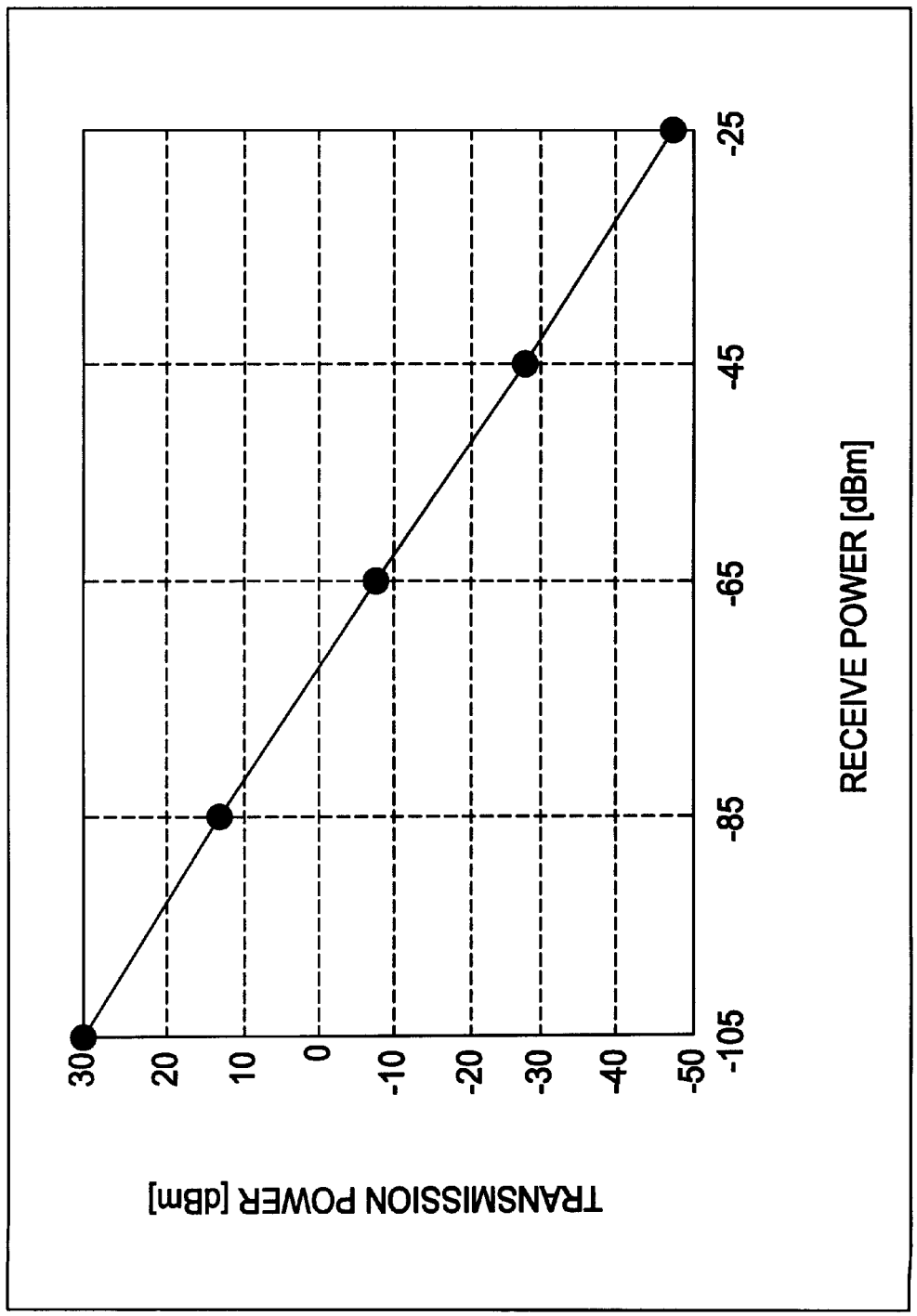
FIG. 2 is a graph showing a standardized open loop power control characteristic for a conventional CDMA cellular portable telephone system.

Since the AGC 5 in the receiver portion of the mobile station affects the detected receive signal strength, and the AMP 13 affects the transmission power in the transmitter portion of the mobile station, and since the AGC 5 and AMP 13 have the same central gain and the same circuit, both the AGC 5 and the AMP 13 exhibit the same characteristic with respect to variations in the environment including changes in temperature. Therefore, with regard to the open loop power control, a lower error is achieved in the open loop power control characteristics shown in FIG. 2 because the gain variations of the AGC 5 and the AMP 13 caused by changes in the environment are canceled by the interaction occurring at the transmission power control amplifier stage 13. That is, a stable and desirable open loop power control characteristic is achieved.

In the mobile station, by allocating the gains of the fixed gain devices in the receiver and transmitter portions, the AGC 5 which affects detected data of a receive signal strength in the receiver portion and the AMP 13 which affects transmission power in the transmitter portion have the same central gain and the same circuit so that stable and desired characteristics of the open loop power control can be achieved in spite of variations in the environment including temperature.

The positions of the automatic gain control amplifier in the receiver portion and the transmission power control amplifier in the transmitter system are not limited to that shown in the described embodiment. For example, the AGC 5 can be placed at the position of the AMP 7 shown in FIG. 1, and the AMP 13 can be placed at the position of the AMP 15 in FIG. 1.

In general, the invention is applicable to wireless telecommunication equipment of the type having a plurality of automatic gain control and transmission power control amplifiers. For example, in a wireless telecommunication equipment which down-converts a received signal by means of a plurality of stages and up-converts a transmission signal by means of a plurality of stages, the wireless telecommunication equipment of the invention may have a plurality of automatic gain control amplifiers and transmission power control amplifiers.

The invention is applicable to wireless, telecommunication systems, in general, and is not limited to the mobile station of a CDMA cellular portable telephone system. Whether the wireless telecommunication equipment has a closed loop power control or not is not significant as long as it has an automatic gain control loop in the receiver portion and an open loop power control.

As for the bias voltage described in the specific disclosed embodiment, which is applied to and controls the operating voltage of the automatic gain control amplifier and the transmission power control amplifier, the bias voltage of the automatic gain control amplifier is not necessarily the same as that of the transmission power control amplifier if the characteristic of the other components in the receiver and transmitter portions are suitably adjusted.

While particular embodiments of the present invention have been described and illustrated, it should be understood that the invention is not limited thereto since modifications may be made by persons skilled in the art. The present application contemplates any and all modifications that fall within the spirit and scope of the underlying invention described and claimed herein.

What is claimed is:

1. A wireless telecommunication equipment having a receiver portion and a transmitter portion, comprising:

an automatic gain control amplifier located in the receiver portion of said equipment, said automatic gain control amplifier having a first gain varied in accordance with an automatic gain control signal input thereto; and a transmission power control amplifier located in the transmitter portion of said equipment, said transmission power control amplifier having a second gain varied in accordance with an open loop control signal input thereto, wherein said automatic gain control amplifier and said transmission power control amplifier have the same operating characteristic and are comprised of amplifier devices, said amplifier devices having the same characteristics and having the same bias voltage applied thereto.

2. A wireless telecommunication equipment according to claim 1, wherein said automatic gain control amplifier and said transmission power control amplifier have the same gain characteristic in accordance with a control signal input thereto when central gains of their variable gain range are 0 dB.

3. A wireless telecommunication equipment according to claim 1, wherein said automatic gain control amplifier and said transmission power control amplifier have the same circuitry.

4. A wireless telecommunication equipment having a receiver portion and a sender portion, comprising:

an automatic gain control amplifier located in the receiver portion of said equipment, said automatic gain control amplifier having a first central gain varied in accordance with an automatic gain control signal input thereto;

a transmission power control amplifier located in the transmitter portion of said equipment, said transmission power control amplifier having a second central gain varied in accordance with an open loop control signal input thereto; and a plurality of fixed gain devices in said receiver and transmitter portions of said equipment, said fixed gain devices have gains allocated thereto which equalize said first central gain and said second central gain.

5. A mobile station of a CDMA cellular phone system comprising:

a receiver portion, said receiver portion including an automatic gain control amplifier having a first input for receiving an input signal, a second input for receiving a gain control signal, and an output;

a transmitter portion, said transmitter portion including a transmission power control amplifier having a first input for receiving a digital modulation signal, and a second input for receiving an open loop control signal, said automatic gain control amplifier and said transmission power control amplifier having substantially the same circuit; and a logic processing unit, said logic processing unit including a receive signal strength detector for receiving the output of said automatic gain control amplifier and having an output for outputting the gain control signal to the second input of said automatic gain control amplifier;

a closed loop power detector; and an adder having a first input coupled to an output of said closed loop power detector and a second input coupled to the output of said receive signal strength detector, said adder outputting the open loop control signal to the second input of said transmission power control amplifier.

6. A mobile station of a CDMA cellular phone system according to claim 5, wherein an orthogonal demodulator and an analog to digital converter are interposed between the output of said automatic gain control amplifier and an input of said receive signal strength detector.

7. A mobile station of a CDMA cellular phone system according to claim 5, wherein an integrator is interposed between the output of said receive signal strength detector and the second input of said adder.

8. A mobile station of a CDMA cellular phone system according to claim 5 wherein a digital to analog converter is interposed between said integrator and the second input of said automatic gain control amplifier.

9. A mobile station of a CDMA cellular phone system according to claim 7 wherein a digital to analog converter is interposed between said integrator and the second input of said automatic gain control amplifier.

* * * * *